(12) United States Patent
Kawamura et al.

(10) Patent No.: US 8,902,140 B2
(45) Date of Patent: Dec. 2, 2014

(54) COLOR CONVERSION FILTER PANEL FOR COLOR ORGANIC ELECTROLUMINESCENT DISPLAY AND COLOR ORGANIC ELECTROLUMINESCENT DISPLAY

(75) Inventors: Yukinori Kawamura, Yokohama (JP); Kohichi Hashimoto, Matsumoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 542 days.

(21) Appl. No.: 13/063,464

(22) PCT Filed: Nov. 11, 2009

(86) PCT No.: PCT/JP2009/006023
§ 371 (c)(1),
(2), (4) Date: May 24, 2011

(87) PCT Pub. No.: WO2010/055654
PCT Pub. Date: May 20, 2010

(65) Prior Publication Data
US 2011/0221741 A1    Sep. 15, 2011

(30) Foreign Application Priority Data
Nov. 11, 2008 (JP) ................... 2008-288972

(51) Int. Cl.
*H05B 33/10* (2006.01)
*H01L 27/32* (2006.01)

(52) U.S. Cl.
CPC .............. *H01L 27/322* (2013.01); *H05B 33/10* (2013.01); *H01L 27/3246* (2013.01); *H01L 27/3283* (2013.01)
USPC ........................................................ 345/83

(58) Field of Classification Search
CPC .............. H01L 27/322; H01L 27/3246; H01L 27/3283; H05B 33/10
USPC .................................................. 345/89, 96, 83
See application file for complete search history.

(56) References Cited

U.S. PATENT DOCUMENTS

| 5,122,711 | A | 6/1992 | Wakimoto et al. |
| 6,221,517 | B1 | 4/2001 | Eida et al. |
| 6,712,661 | B1 | 3/2004 | Kiguchi et al. |
| 7,091,660 | B2 | 8/2006 | Park et al. |
| 2003/0222576 | A1* | 12/2003 | Lu .................. 313/504 |
| 2004/0201048 | A1 | 10/2004 | Seki et al. |
| 2005/0046341 | A1 | 3/2005 | Ikeda et al. |
| 2005/0110852 | A1* | 5/2005 | Lee et al. ......... 347/97 |
| 2005/0134170 | A1 | 6/2005 | Otani et al. |

(Continued)

FOREIGN PATENT DOCUMENTS

| JP | 02-216790 A | 8/1990 |
| JP | 08-286033 A | 11/1996 |

(Continued)

*Primary Examiner* — Quan-Zhen Wang
*Assistant Examiner* — Tony Davis
(74) *Attorney, Agent, or Firm* — Rabin & Berdo, P.C.

(57) ABSTRACT

Separating partition walls, demarcating regions forming adjacently color conversion layers having different chromaticities that are stacked and arranged by an inkjet method, have at least one incision in tip faces of both length-direction end portions extended outside the screen region. A color conversion filter panel can be provided having separating partition wall structures which, when forming color conversion layers using an inkjet method, can prevent color mixing of inks between adjacent color conversion layers at length-direction end portions of the separating partition walls.

15 Claims, 5 Drawing Sheets

(56) References Cited

U.S. PATENT DOCUMENTS

| | | |
|---|---|---|
| 2007/0200488 A1 | 8/2007 | Ito |
| 2008/0100654 A1* | 5/2008 | Kitahara et al. ............... 347/12 |
| 2009/0108271 A1* | 4/2009 | Chou et al. ..................... 257/88 |
| 2011/0155296 A1* | 6/2011 | Nakamura et al. ............. 156/67 |

FOREIGN PATENT DOCUMENTS

| | | |
|---|---|---|
| JP | 2000-122072 A | 4/2000 |
| JP | 2000-353594 A | 12/2000 |
| JP | 2001-230073 A | 8/2001 |
| JP | 2002-318543 A | 10/2002 |
| JP | 2003-229260 A | 8/2003 |
| JP | 2003-229261 A | 8/2003 |
| JP | 2004-039580 A | 2/2004 |
| JP | 2004-111166 A | 4/2004 |
| JP | 2004-288403 A | 10/2004 |
| JP | 2005-050597 A | 2/2005 |
| JP | 2005-071656 A | 3/2005 |
| JP | 2005-166266 A | 6/2005 |
| JP | 2006-073222 A | 3/2006 |
| JP | 2007-095342 A | 4/2007 |
| JP | 2007-234232 A | 9/2007 |
| JP | 2008-269923 A | 11/2008 |
| WO | WO-00-18193 A1 | 3/2000 |

* cited by examiner

COLOR CONVERSION FILTER PANEL FOR COLOR ORGANIC ELECTROLUMINESCENT DISPLAY AND COLOR ORGANIC ELECTROLUMINESCENT DISPLAY

BACKGROUND

1. Technical Field

This invention relates to a color conversion filter panel, which is combined with an organic electroluminescent (EL) light-emitting panel to form a color organic EL display. More specifically, this invention relates to the structure of a separation partition wall that the color conversion filter panel comprises.

2. Background Information

One multicolor light emission method to obtain full-color or multicolor images in an organic EL display is a color conversion method in which light emitted by a light-emitting panel is absorbed, wavelength-converted into light at a wavelength different from the absorbed wavelength, and is emitted. In this method, a color conversion filter panel is positioned at the front face of the light-emitting panel.

A color conversion filter panel has a basic structure in which a color conversion layer including a color conversion dye is arranged on a transparent substrate. As a method of pattern formation on such a panel, Japanese Patent Application Laid-open No. H08-286033 discloses a method in which the color conversion layer is formed into a pattern by a photolithography method, using a material in which the color conversion dye is dispersed in photoresist or another polymer material. And, the method, disclosed in Japanese Patent Application Laid-open No. H02-216790, of forming a pattern by a method of evaporation deposition of the color conversion dye or another dry process is well known.

Further, the method, in Japanese Patent Application Laid-open No. 2000-122072, of using an inkjet method in pattern formation of a color conversion layer is well known.

Japanese Patent Application Laid-open No. 2000-353594 discloses, in light of the above methods, a method of providing separating partition walls between patterns of color conversion layers, to regulate the spread of ink drops dispensed by an inkjet method. Japanese Patent Application Laid-open No. 2007-095342 and similar disclose a method of regulating the ink wettability of materials used in the separating partition walls, and a method of making the cross-sectional shape of the separating partition walls an inverted trapezoid to control the thickness of the applied film to be uniform.

As stated above, when color conversion layers adjacent on a substrate and with different chromaticities are formed in patterns by an inkjet method, the provision of separating partition walls between patterns to prevent spreading of ink drops is a well-known technique. However, even if a simple separating partition wall is provided, color mixing of inks between adjacent color patterns due to the effects of the ink wettability of the separating partition wall material and the ink surface tension cannot be prevented.

Japanese Patent Application Laid-open No. 2004-111166 discloses a method, in a method of using an inkjet method to form organic light-emitting layers of different chromaticities in each of the subpixel regions divided into a matrix-like mesh by insulating partition walls between electrodes in order to enable multicolor emission of an organic EL light-emitting panel, of providing depressions and protrusions on the insulating partition walls, to prevent color mixing of inks between adjacent organic light-emitting layers.

When the above technique is employed to provide separating partition walls having depressions and protrusions on matrix-like mesh-shape partition walls on a transparent substrate, and an inkjet method is used to form color conversion layers between the separating partition wall meshes, color mixing of inks which pass over the separating partition walls can be prevented. However, when a color conversion filter panel obtained by this method and an organic EL light-emitting panel are joined together with a transparent resin layer interposed between the two panels to manufacture a photoemission-type organic EL display, the flow of transparent resin is obstructed by the matrix-like mesh-shape separating partition walls. As a result, uniform packing of the transparent resin in each of the meshes is extremely difficult, and numerous air bubbles remain between the two panels, causing unevenness in the image brightness.

When manufacturing a photoemission-type organic EL display by joining together a color conversion filter panel and an organic EL light-emitting panel with a transparent resin interposed between the two panels, by using a color conversion filter panel in which separating partition walls are arranged in stripe shapes on a transparent substrate, satisfactory flow of the transparent resin can be obtained, and the remaining of air bubbles between separating partition walls can be prevented. Further, by providing depressions and protrusions on the stripe-shape separating partition walls, applying the above-described technique, it is possible to prevent color mixing of adjacent inks for color conversion layer formation which pass over separating partition walls when using an inkjet method to form color conversion layers between separating partition walls.

When forming color conversion layers by an inkjet method utilizing separating partition walls arranged in stripe shapes, at the length-direction end portions of the separating partition walls, ink for color conversion layer formation leaks out to outside color conversion layer formation regions along the side walls of separating partition walls due to the wettability with the separating partition wall faces and similar, and leaks out into the tip portion regions of separating partition walls and/or adjacent color conversion layer formation regions, giving rise to color mixing between inks, as shown in FIG. 8. The leaking-out of ink along the side faces of the length-direction end portions of these separating partition walls reduces the effective screen region relative to the color conversion layer formation region. Further, in order to secure an effective screen region, it is necessary to anticipate the leaking-out of ink and secure a large frame region surrounding the screen region.

SUMMARY

An object of the invention is to provide, in the manufacture of a color conversion filter panel, a color conversion filter panel having a separating partition wall structure capable of preventing leaking-out of ink for color conversion layer formation and color mixing at both length-direction end portions of separating partition walls when using an inkjet method to form color conversion layers between separating partition walls, as well as a color organic EL display comprising this color conversion filter panel.

As a result of diligent studies to attain the above object, these inventors discovered that leaking-out of ink for color conversion layer formation to adjacent color conversion layer formation regions at the length-direction end portions of separating partition walls when forming color conversion layers by an inkjet method is due to the wettability by ink for color conversion layer formation along the side faces of separating partition walls, and that by providing an incision in the tip face of length-direction end portions of separating partition walls positioned on the extensions of the screen region, and extending the wetting length along the wall faces, color mixing between color conversion layers passing over the length-direction end portions of separating partition walls can be prevented.

A color conversion filter panel of this invention is a color conversion filter panel configuring a color organic EL display, and has a transparent substrate; color conversion layers for at least two colors stacked and arranged adjacently in a stripe shape by an inkjet method on at least a portion of the transparent substrate; and a separating partition wall arranged in a stripe shape demarcating regions forming the color conversion layers, the separating partition wall having at least one incision at each of tip faces of both length-direction end portions extending to outside the screen region.

The incisions in the tip faces of the length-direction end portions of the separating partition walls may be enlarged toward the inside the screen region to form a cavity, and the side walls of the length-direction end portions may have protruding portions on the extensions of the color conversion layer formation regions outside the screen region.

The adjacent color conversion layers are formed of a red color conversion layer and a green color conversion layer, the red color conversion layer converting blue-green light in the wavelength range 400 nm to 600 nm, normally emitted from an organic EL light-emitting panel, and the green color conversion layer converting the same into red light in the wavelength range 600 nm or greater and into green light in the wavelength range 500 nm to 600 nm.

The transparent substrate may include a black matrix, arranged in a matrix-like mesh shape or a stripe shape and having aperture portions with the dimensions of subpixels demarcating color patterns on a transparent supporting substrate, and may further include a color filter arranged in a stripe shape and in close contact with the transparent supporting substrate and exposed by the aperture portions of the black matrix.

The color conversion filter panel may further include a protective layer on the color conversion layers.

A preferred embodiment of the color conversion filter panel has a transparent substrate, including a black matrix arranged on a transparent supporting substrate in a matrix-like mesh shape having apertures with subpixel dimensions demarcating a color pattern, and color filters arranged in repeated stripe shapes of red (R), green (G) and blue (B) in close contact with the transparent supporting substrate and exposed by aperture portions of the black matrix; a separating partition wall, arranged on the black matrix between the color filters of the transparent substrate, or on the black matrix between adjacent red color and green color filters and on the black matrix between the blue color filter regions between green color and red color filters and the black matrix on both sides thereof; and, a red color conversion layer and green color conversion layer, stacked and arranged by an inkjet method on top of the red color and green color filters respectively.

A color organic EL display of this invention is a color organic EL display combining an organic EL light-emitting panel which emits light in a prescribed wavelength range and a color conversion filter panel, and is characterized in that the color conversion filter panel is a color conversion filter panel including any of the above-described configurations.

As shown in FIG. 1 and FIG. 3, in a color conversion filter panel of this invention, separating partition walls have incisions in the tip faces of both length-direction end portions extending outside the screen region. Hence when color conversion layers are stacked using an inkjet method, the leakage lengths of ink for color conversion layer formation along the side walls of length-direction end portions of the separating partition walls are extended, and ink for color conversion layer formation along separating partition walls accumulates in cavities due to incisions, so that color mixing of ink within adjacent color conversion layer formation regions is prevented. As a result, not only can nearly the entirety of color conversion layer formation regions be secured as an effective screen region, but there is no need to secure frame regions on the outer perimeter of the screen region to take color mixing into account.

Further, when manufacturing a color organic EL display of this invention, separating partition walls are arranged in stripe shapes. Hence satisfactory flow of the transparent resin interposed between the color conversion filter panel and the organic EL light-emitting panel is obtained, the transparent resin can be interposed uniformly over the entirety of the screen region, and a satisfactory display without unevenness in color development can be obtained.

DETAILED DESCRIPTION

In this Specification, the term "color conversion layer formation region" means a region to which ink for color conversion layer formation is imparted, demarcated by separating partition walls arranged in stripe shapes, when stacking and arranging color conversion layers in stripe shapes on a color conversion filter panel using an inkjet method. Further, the term "screen region" means the region in which the color conversion layers are formed uniformly, and from which a normal image is obtained.

Figure 1:
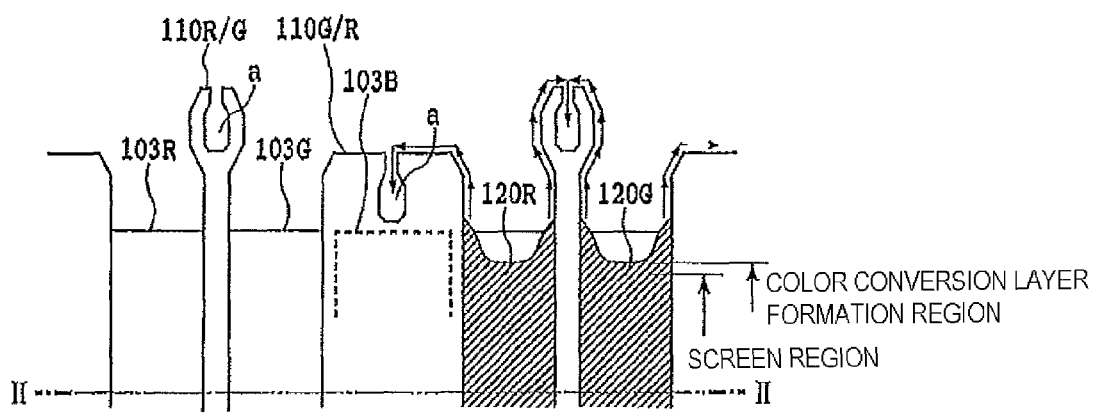
FIG. 1 is a schematic partial enlarged plane view, showing one embodiment of a length-direction end portion of a separating partition wall in a color conversion filter panel of this invention.
Figure 2:
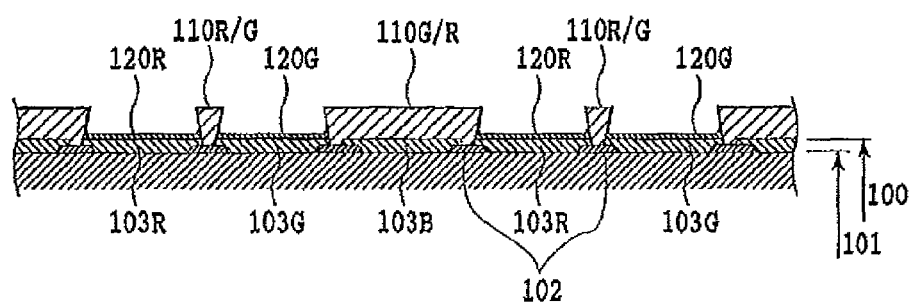
FIG. 2 is a schematic cross-sectional view along "II"-"II" in FIG. 1.
Figure 3:
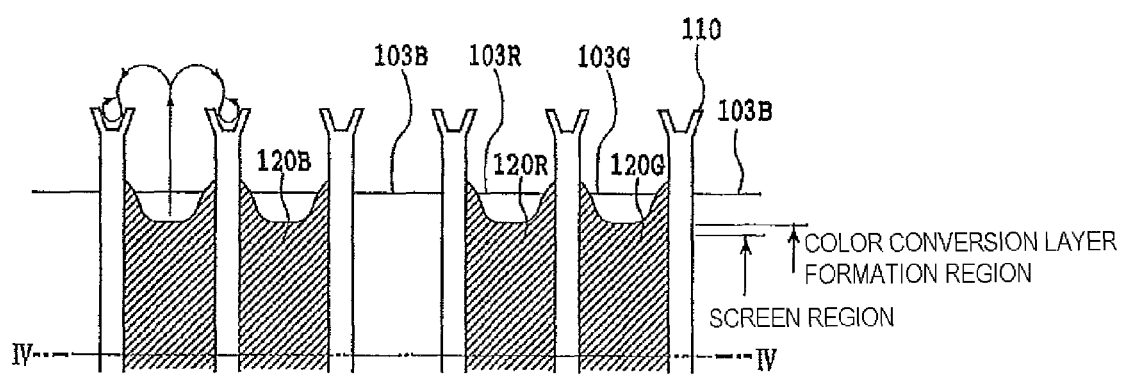
FIG. 3 is a schematic partial enlarged plane view showing one embodiment of a length-direction end portion of a separating partition wall in a color conversion filter panel of this invention.
Figure 4:
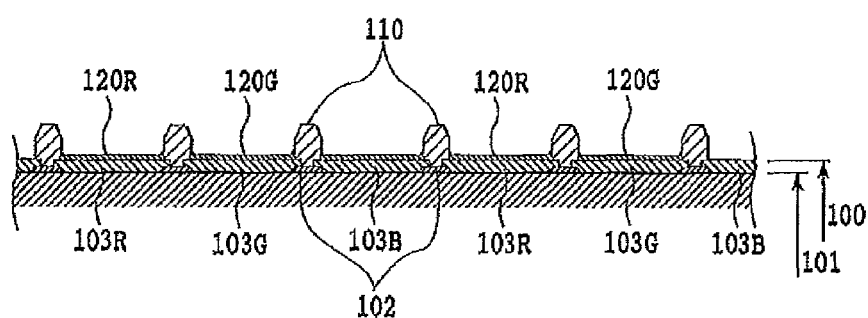
FIG. 4 is a schematic cross-sectional view along "IV"-"IV" in FIG. 3.
Figure 5:
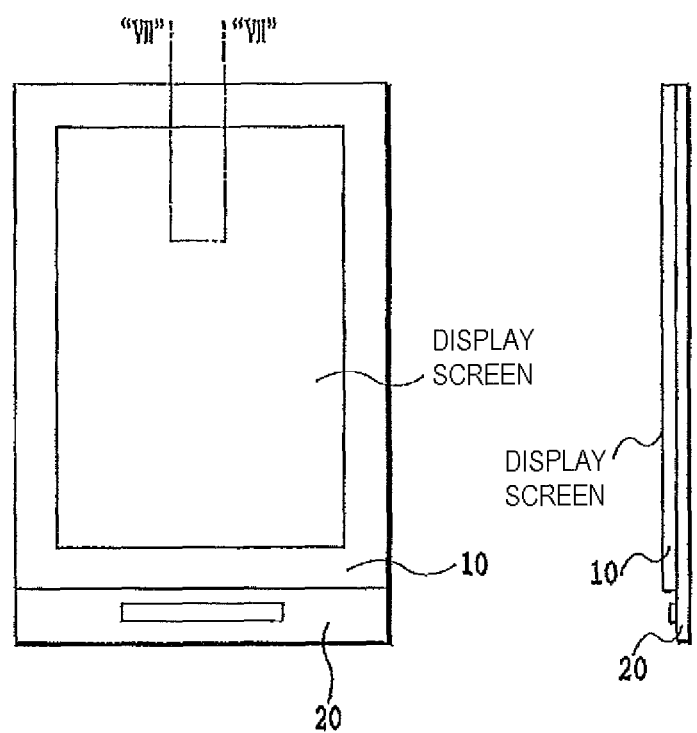
FIG. 5 is a front view and side view showing the configuration of an organic EL display.
Figure 6:
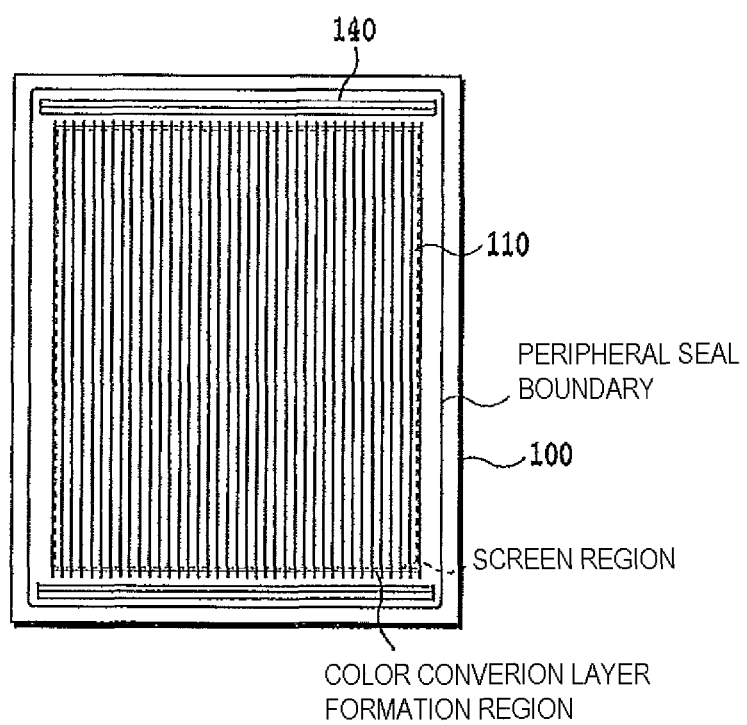
FIG. 6 is a schematic plane view showing the basic configuration of a color conversion filter panel.
Figure 7:
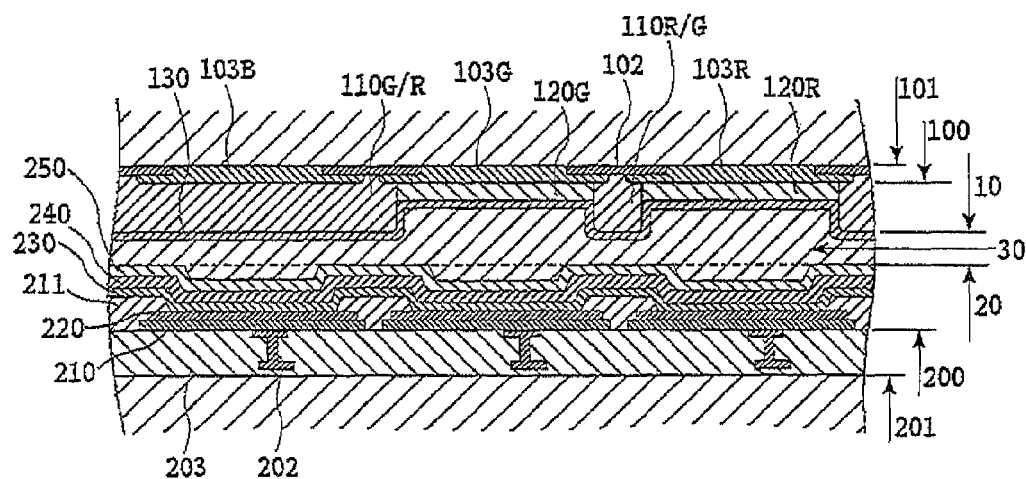
FIG. 7 is a schematic plane view along "VII"-"VII" in FIG. 5.
Figure 8:
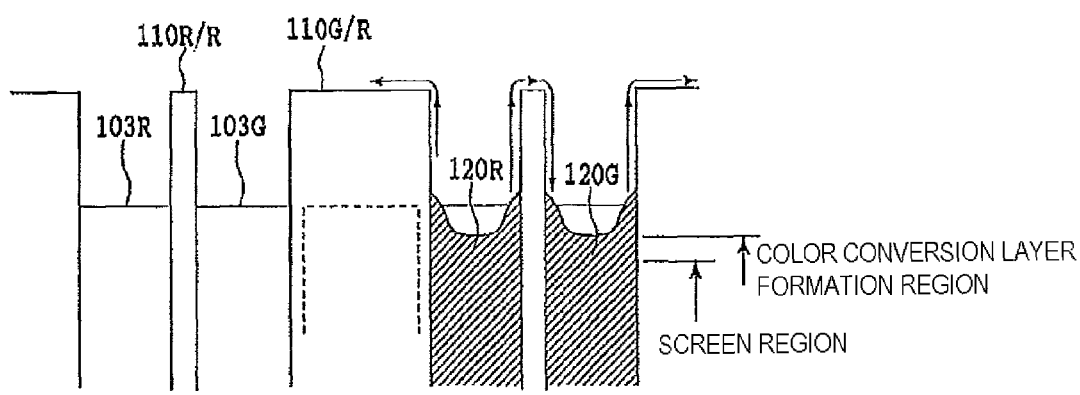
FIG. 8 is a schematic partial enlarged plane view, showing an embodiment of a length-direction end portion of a separating partition wall in a color conversion filter panel of the prior art.

This invention is explained in detail based on FIG. 1 to FIG. 8. FIG. 1 is a schematic partial enlarged plane view showing the structure of length-direction end portions of separating partition walls, and the flow of ink, in the color conversion filter panel of one embodiment of the invention. FIG. 2 is a schematic cross-sectional view along "II"-"II" in FIG. 1. FIG. 3 is a schematic partial enlarged plane view showing the structure of length-direction end portions of separating partition walls in another embodiment of the invention. FIG. 4 is a schematic cross-sectional view along "IV"-"IV" in FIG. 3. FIG. 5 is a front view and side view of a color organic EL display. FIG. 6 is a schematic plane view showing the overall configuration of a color conversion filter panel. FIG. 7 is a schematic cross-sectional view along "VII"-"VII" in FIG. 5. And FIG. 8 is a schematic partial enlarged plane view showing the structure of length-direction end portions of separating partition walls, and the flow of ink, in a color conversion filter panel of the prior art.

As shown in FIG. 5, a color conversion filter panel of this invention is a color conversion filter panel 10 for use in combination with an organic EL light-emitting panel 20 which emits monochromatic light, and has a basic structure comprising the color conversion layers 120 arranged in stripe shapes on a transparent substrate 100 as shown in FIG. 6 and FIG. 7, and a plurality of separating partition walls 110 arranged in stripe shapes demarcating these formation regions.

The transparent substrate 100 has high optical transmissivity, and moreover can withstand the formation conditions of the layers formed thereupon in sequence, such as for example the temperatures, solvents, and similar, and moreover has excellent dimensional stability; for example glass substrate, transparent plastic substrate, or another transparent supporting substrate 101 may be used solely, or may be either a substrate in which only a black matrix 102 is arranged on a transparent supporting substrate 101, or a substrate on which is arranged only a color filter 103, or a substrate on which are arranged both a black matrix 102 and a color filter 103, as shown in FIG. 2 and FIG. 4. Further, the transparent substrate 100 may further have a planarizing layer which planarizes the depressions and protrusions in the surface due to the black matrix 102 and/or color filter 103, and a protective layer on the planarizing layer (not shown).

As the transparent substrate 100 used in a color conversion filter panel for a full-color or multicolor organic EL display, it is preferable that, as shown in FIG. 2, FIG. 4, and FIG. 7, a substrate be used in which are arranged, on a transparent supporting substrate 101, a black matrix 102 arranged in a matrix-like mesh shape or stripe shape having aperture portions, and color filters 103R, G, B of red (R), green (G), and blue (B) in close contact with the transparent supporting substrate 101 and exposed by the aperture portions of the black matrix 102, arranged in stripe shapes with R-G-B repetition.

Each of the aperture portions in the black matrix 102 has the dimensions of a color pattern subpixel, and a unit pixel of the color conversion filter panel is formed by one subpixel from each of the red (R), green (G), and blue (B) color filters 103R, G, B, in close contact with the transparent supporting substrate and exposed from these aperture portions. Hence it is preferable that the black matrix 102 be of a matrix-like mesh shape having aperture portions which can secure prescribes subpixel dimensions, specifically, 80 μm×200 μm or less, and it is still more preferable that the shape be a matrix-like mesh shape having aperture portions which can secure dimensions of 60 μm×180 μm or less.

The black matrix 102 comprises a layer which absorbs and does not transmit visible light, having a pattern width of 30 μm or less, normally, 20 μm or less in the vertical direction and 25 μm or less in the horizontal direction, and with a film thickness of 2 μm or less, and normally of 1 μm; by means of the aperture portions, the subpixel dimensions of the color filters 110R, G, B on the transparent supporting substrate 101 are secured.

The red color filter 103R, green color filter 103G, and blue color filter 103B each comprise layers of film thickness 2 μm or less, and normally 1 μm, on the transparent supporting substrate 101, which selectively transmit light of wavelength 600 nm or greater, light of wavelength 500 nm to 600 nm, and light of wavelength 400 nm to 550 nm, respectively.

Color filters corresponding to black, red, green, and blue which are generally used in liquid crystal displays and other flat panels can be adopted as the black matrix 102 and the color filters 103R, G, B, and pigment-disperse type color filters in which pigments are dispersed in photoresist can be suitably adopted.

To form the black matrix 102 and the color filters 103R, G, B, a photolithography method using the above pigment-disperse type color filter materials can be suitably adopted; first, the black matrix 102 is formed on the transparent supporting substrate 101, and then the color filters 103R, G, B are formed in order. No limitations in particular are placed on the order of formation of the color filters 103R, G, B, but normally formation is in the order R-G-B. When the separating partition walls 110 are arranged on the transparent substrate 100 prior to formation of the color filters 103R, G, B, the separating partition walls 110 may be used in formation by an inkjet method employing inks containing color materials.

As shown in FIG. 1 and FIG. 3, a color conversion filter panel of this invention has, on at least a portion of the transparent substrate 100, color conversion layers 120 in at least two colors, that is with different chromaticities, stacked and arranged adjacently in stripe shapes by an inkjet method, and a plurality of separating partition walls 110 arranged in stripe shapes demarcating regions of formation of these color conversion layers 120; the tip faces of both length-direction end portions of the separating partition walls 110 extending outside the screen region have at least one incision.

No limitations in particular are placed on the shape of the incisions in the tip faces of both length-direction end portions of the separating partition walls 110, so long as the shape enables extension of the wetting length of the tip face by ink for color conversion layer formation; for example, an incision in a tip face may be a shape which expands toward the inside of the separating partition wall to form a cavity a, as shown in FIG. 1, or may be a shape forming a U-shape or V-shape, as shown in FIG. 3. In particular, in the shape shown in FIG. 1, the flow of ink along the side walls of the separating partition walls is such as to accumulate within the cavities, as indicated by the arrows in FIG. 1, and so does not reach the adjacent color conversion layer formation region as in the example of the prior art in FIG. 8.

Further, it is preferable that the separating partition walls 110, and in particular the side walls on both length-direction end portions of the separating partition walls 110R/G dividing adjacent color conversion layer formation regions, have protruding portions on the extension of the color conversion layer formation regions, as shown in FIG. 1 and FIG. 3. Here it is preferable that the protrusion angle of the protrusion portions be 30° or less with respect to the line of extension of the color conversion layer formation region. If the protrusion angle exceeds 30°, the flow of the transparent resin layer 30 may be obstructed when manufacturing an organic EL display by joining the color conversion filter panel 10 to an organic EL light-emitting panel 20 with the transparent resin layer 30 interposed.

It is sufficient for the lengths of both length-direction end portions of separating partition walls 110 extending outside the screen region, which in the prior art had been required to be two pixel lengths or greater, to be two pixel lengths, and shortening to one pixel length is also possible.

It is preferable that the separating partition wall 110 have a cross-sectional shape capable of preventing leaking due to splashing and/or wettability of ink for color conversion layer formation at the time of color conversion layer formation; for example, an inverted-trapezoid cross-sectional shape such as shown in FIG. 2, or a cross-sectional shape which swells the upper face into a hill shape and extends the wetting length such as shown in FIG. 4, may be used.

As shown in FIG. 3 and FIG. 4, the separating partition wall 110 may be arranged between each of the red (R), green (G), and blue (B) color patterns. Further, when a blue color conversion layer is not arranged, it is sufficient that the separating partition walls 110 be separating partition walls 110R/G arranged between the red color filters 103R and the green color filters 103G, and separating partition walls 110G/R arranged between the green color filters 130G and the red color filters 103R including above the blue color filters 102B, as shown in FIG. 1 and FIG. 2.

Because the incisions in the tip faces of the separating partition walls 110 are formed perpendicularly to the color conversion filter panel substrate 100, they can easily be formed, even in considerably complex shapes, by a photolithography method using a photosensitive resin, or by a dry etching method using an inorganic material. For example, in the case of an organic material, formation by a photolithography method is possible using a photosensitive resin composition having as the hardening component a polymer material, and preferably a polymer material having a siloxane skeleton, such as a novolac resin, acrylic resin, epoxy resin, polyimide resin, or similar. In the case of an inorganic material, formation is possible by depositing an inorganic film such as of $SiO_x$, $SiN_x$, $SiN_xO_y$, $AlO_x$, $TiO_x$, $TaO_x$, $ZnO_x$, or similar, forming resist having apertures in a prescribed pattern on the film, and using $CF_4$ or another etching gas to perform etching in a dry etching method.

A color conversion layer 120 is a layer which converts the wavelength range of light emitted from the organic EL light-emitting panel 20 into the wavelength range of light with a desired chromaticity, and emits the light at the rear surface of the color conversion filter panel substrate 100, and is formed by using an inkjet apparatus to dispense ink for color conversion layer formation containing a color conversion dye into color conversion layer formation regions, using the separating partition walls 110, and drying.

As the above color conversion dye, low-polymer system organic fluorescent dyes, such as $Alq_3$ (tris (8-quinolinato) aluminum complex) and other aluminum chelate system dyes, 3-(2-benzothiazolyl)-7-diethylamino coumarin (coumarin 6), 3-(2-benzimidazolyl)-7-diethyl amino coumarin (coumarin 7), coumarin 135, and other coumarin system dyes; and Solvent Yellow 43, Solvent Yellow 44, and other naphthalimido system dyes; and as well as high-polymer fluorescent materials, of which polyphenylenes, polyarylens, and polyfluorenes are representative, may be used. These may be used single, or as mixtures of two or more types.

In a color conversion filter panel for a full-color or multi-color organic EL display, light in the wavelength range 400 to 600 nm emitted by an organic EL light-emitting panel 20 is converted into red light in a wavelength range of 600 nm and above by a red color conversion layer 120R, and is converted into green light in a wavelength range of 450 nm to 600 nm by a green color conversion layer 120G, which are arranged in adjacent color conversion layer formation regions demarcated by the separating partition walls. A blue color conversion layer 120S may also be arranged, but because light emitted from the organic EL light-emitting panel 20 has sufficient emission intensity in the blue region, normally this is omitted by arranging a light transmission layer. As the light transmission layer, normally the above-described separating partition walls 110G/R are arranged.

As shown in FIG. 1 and FIG. 2, a color conversion filter panel 10 preferable for use in a full-color organic EL display has, a transparent substrate 100 having, arranged on a transparent supporting substrate 101, a matrix-like mesh shape black matrix 102 having aperture portions with the dimensions of subpixels of a color pattern, and color filters 103R, G, B arranged in repeating red (R), green (G), and blue (B) stripe shapes, in close contact with the transparent supporting substrate 101 and exposed by the aperture portions of the black matrix 102; separating partition walls 110R/G arranged in stripe shapes above the black matrix 102 between red color filters 103R and green color filters 103G of the transparent substrate 100, and separating partition walls 110G/R arranged in stripe shapes on the black matrix 102 above and on both sides of the blue color filters 103B; as well as at least red color conversion layers 120R and green color conversion layers 120G, arranged in stripe shapes above and corresponding to the red color filters 103R and green color filters 103G respectively; and having incisions, as shown in FIG. 1 or FIG. 3, in the tip faces of the separating partition walls 110R/G and G/R.

The color conversion filter panel 10 may have a protective layer 130 on the color conversion layers 120 as shown in FIG. 7, and may have one or a plurality of resin guide walls 140, continuous or intermittent, between the tip faces in both length-direction end portions of the separating partition walls 110 and the peripheral seal boundary, as shown in FIG. 6.

The protective layer 130 is a layer which covers the entirety of the region including the black matrix 102, color filters 103, separating partition walls 110, and color conversion layers 120, and prevents degradation of the color conversion layers 120 due to water and/or oxygen, and which sustains the performance thereof with stability. The protective layer 130 has transparency such that the transmissivity for visible light at wavelengths in the range 400 nm to 700 nm is 50% or higher. For example, inorganic oxide films and inorganic nitride films such as SiOx, SiNx, SiNxOy, AlOx, TiOx, TaOx, ZnOx, and similar are comprised; these transparent inorganic films can be deposited onto the above region using a sputtering method, CVD method, vacuum evaporation deposition method, or various other film deposition methods.

The resin guide walls 140 are arranged, as a single wall or a plurality of walls, preferably as from two to five walls, and still more preferably as three walls, perpendicularly to the separating partition walls 110 between the tip faces of both length-direction end portions of the separating partition walls 110 and the peripheral seal boundary, and have the length of at least one pixel on one side of the screen region, and may comprise structures which are continuous as shown in FIG. 6, or intermittent structures, not shown.

At the time of manufacture of the color organic display described below, the resin guide walls 140 guide the flow of the transparent resin interposed between the color conversion filter panel and the organic EL light-emitting panel along the separating partition walls 110 in directions perpendicular to the separating partition walls 110, causing the transparent resin to fill the entire screen region without excesses or deficiencies.

The resin guide walls 140 can be formed from material similar to that of the separating partition walls 110, and preferably are formed by a process performed simultaneously with formation of the separating partition walls 110.

A method of manufacture of a color conversion filter panel of this invention comprises at least a process of preparing a transparent substrate 100; a process of forming, on at least a portion of the transparent substrate 100, separating partition walls 110; and a process of forming color conversion layers 120 with different chromaticities by an inkjet method, in adjacent color conversion layer formation regions demarcated by the separating partition walls 110; and may further comprise a process of covering the separating partition walls 110 and color conversion layers 120 with a protective layer 130, and a process of forming resin guide walls 140. The process of formation of resin guide walls 140 can be performed simultaneously with the process of formation of the separating partition walls 110.

A color organic EL display of this invention is a display formed by combining a color conversion filter panel 10 of this invention and an organic EL light-emitting panel 20 which emits monochromatic light, with a transparent resin layer 30 interposed, as shown in FIG. 5.

The organic EL light-emitting panel 20 may be a panel in which, as shown in FIG. 7, an organic EL layer 230, comprising a stacked structure including an organic light-emitting layer (not shown) which emits monochromatic light upon application of a voltage, is inserted between a reflecting electrode 220 and a transparent electrode 240, and which emits light in the blue-green region of wavelength 400 to 600 nm, emitted by the organic EL light-emitting layer, through the transparent electrode 240.

The organic EL light-emitting panel 20 may be an organic EL light-emitting panel manufactured independently and separately from the color conversion filter panel 10, or may be an organic EL light-emitting panel manufactured in succession following manufacture of the color conversion filter panel 10 on a planarizing layer comprising a transparent resin layer 30 formed on the color conversion filter panel 10.

An example of a preferred organic EL light-emitting panel 20 manufactured independently for a top-emission type display comprises, as shown in FIG. 7, a light-emitting panel substrate 200 formed by constructing TFT structures 202 on a glass substrate 201, planarizing the surface using a planarizing layer 203, then covering the planarizing layer 203 with an inorganic passivation layer (not shown); and thereupon, a base layer 210 connected to the TFT structures 202 via contact holes (not shown) provided in the planarizing layer 203 and inorganic passivation layer; a reflective electrode 220, arranged in contact with the base layer 210; an insulating layer 211, arranged between the base layer 210 and the reflecting electrode 220; an organic EL layer 230, stacked on the insulating layer 211 and reflecting electrode 220; a transparent electrode 240, arranged on the organic EL layer 230 corresponding to the reflective electrode 220; and, an inorganic barrier layer 250, covering the organic EL layer 230 and the transparent electrode 240.

On the other hand, an organic EL light-emitting panel 20 for a bottom-emission type display, not shown, comprises an inorganic barrier layer 250 formed directly on a planarizing layer comprising a transparent resin layer 30 interposed on the color conversion filter 10 in succession to formation of the transparent resin layer 30; transparent electrodes 240 arranged in stripe shapes on the inorganic barrier layer 250; an insulating layer (not shown) arranged between the transparent electrodes 240 and having aperture portions over the transparent electrodes 240; an organic EL layer 230 on the transparent electrodes 240 and insulating layer; and reflecting electrodes 220 arranged in stripe shapes on the organic EL layer 230 and perpendicularly intersecting the transparent electrodes 240.

In a top-emission type display, a color conversion filter panel 10 of this invention and an organic EL light-emitting panel 20 manufactured independently thereof are joined together with a transparent resin layer 30 interposed, and by means of a peripheral seal member arranged along the peripheral seal boundary of both these substrates 100 and 200, the entire perimeter of the layer-structure region of the color conversion filter panel 10 and organic EL light-emitting panel 20 is enclosed, and is sealed within the peripheral seal boundary. By means of the transparent resin layer 30 and peripheral seal member, intrusion of outside air, and in particular of water, into the layer-structure portion of the color conversion filter panel 10 and organic EL light-emitting panel 20 is prevented.

In a top-emission type display, the transparent resin layer 30 comprises a thermosetting resin with excellent transparent properties having adhesive properties enabling close contact with the separating partition walls 110 and color conversion layers 120 of the color conversion filter panel 10 or with the protective layer 150 which if desired covers these, and also with the inorganic barrier layer 250 of the organic EL light-emitting panel 20, and for example comprises an epoxy system resin adhesive, which is packed within the peripheral seal boundary spanning the color conversion layer formation regions of the color conversion filter panel.

Further, the peripheral seal member is a structural member which adheres to both the transparent substrate 100 of the color conversion filter panel 10 and the organic EL light-emitting panel substrate 200, and seals the peripheral seal boundary, and comprises a peripheral seal material including a peripheral seal boundary wall constructed along the peripheral seal boundary of one among the two substrates (100 and 200) and a photosetting resin, or else a single peripheral seal material.

A top-emission type display is manufactured by arranging a transparent resin 30 either in a point shape at one point or a plurality of points on the color conversion filter panel 10, or in a rod shape at right angles to the separating partition walls 110, and then positioning with the organic EL light-emitting panel 20 under reduced pressure and pressure-bonding, pressing the transparent resin 30 outward into the screen region of the color conversion filter panel 10, and exposing the unhardened peripheral seal material provided along the peripheral seal boundary to perform temporary hardening, after which the reduced pressure is broken and the color conversion filter panel 10 and organic EL light-emitting panel 20 are further pressure-bonded, and are heated to cause complete hardening of the transparent resin 30 and peripheral seal material.

A satisfactory flow is obtained for the transparent resin 30 arranged on the color conversion filter panel 10 along the separating partition walls 110, by means of separating partition walls 110 arranged in stripe shapes, by means of the pressure-bonded organic EL light-emitting panel 20; and, the flow along the separating partition walls 110 is guided by the resin guide walls 140 in directions perpendicular to the separating partition walls 110, to pack the inside of the peripheral seal boundary without excesses or deficiencies.

On the other hand, in a bottom-emission type display (not shown; however, elements common to a top-emission type display are represented by the same symbols) a transparent resin layer 30 which planarizes the protrusions and depressions due to the separating partition walls 110, color conversion layers 120 and similar on the color conversion filter panel 10, that is, a planarizing layer is interposed, and following formation of the transparent resin layer 30, the organic EL light-emitting panel 20 is formed in succession on the transparent resin layer 30, and in addition a peripheral seal member arranged along the peripheral seal boundary of the transparent substrate 100 of the color conversion filter panel 10 is used to seal the layer-structure portion of the color conversion filter panel 10 and organic EL light-emitting panel 20.

In a bottom-emission type display, the transparent resin layer 30 comprises a liquid resin composition which can be applied onto the color conversion filter panel 10, such as for example a hardened layer of a liquid resin composition obtained by dissolving in a reactive or unreactive solvent an acrylic resin, epoxy resin, or other phototransmissive resin and a thermoinitiator, photoinitiator, or thermophotoinitiator; the color conversion filter panel 10 is provided on its entire surface with a surface which is sufficiently flat to enable formation of the organic EL light-emitting panel 20 thereon.

Such a transparent resin layer 30 is formed by applying the liquid resin composition onto the color conversion filter panel 10, drying if necessary to remove solvent, and then causing thermosetting or photosetting. No limitations in particular are placed on the method of application of the liquid resin composition, but normally a spin-coating method is suitably adopted.

When applying the liquid resin composition onto the color conversion filter panel 10, not only do the separating partition walls 110 and guide walls 140 arranged on the color conversion filter panel 10 guide the flow of the liquid resin composition similarly to the case of a top-emission type display, but the guide walls 140 act as an embankment, preventing collapse of surface planarization at both end portions of the separating partition walls 110 which can occur when there are no guide walls 140, so that an extremely flat surface can be obtained over the entire screen region.

Further, the peripheral seal member comprises a glass substrate or other flat sealing substrate and a peripheral seal boundary wall and peripheral seal material, or a peripheral seal material alone, and is arranged along the peripheral seal boundary on the transparent substrate 100 of the color conversion filter panel 10. The peripheral seal boundary wall may be formed on either the transparent substrate 100 or on the sealing substrate; the peripheral seal material may be either bonded to both the transparent substrate 100 and the sealing substrate, or may be bonded to the peripheral seal boundary wall and the other substrate to seal the interior of the peripheral seal boundary.

EXAMPLES

This invention is explained in further detail using the following examples and comparative examples.

Example 1

Color conversion filter panel
Preparation of the Transparent Substrate 100

On a transparent glass supporting substrate (product number 1737, manufactured by Corning Inc.) 101 was formed, by a photolithography method, a black matrix 102 with a matrix-like mesh shape having aperture portions with the subpixel dimensions of 180 µm×60 µm, with a pattern width of 20 µm in the vertical direction and 25 µm in the horizontal direction, and a film thickness of 1 µm. Next, the same photolithography method was used to form, in a stripe shape in close contact with the glass supporting substrate 101, color filters 103R, G, B in red (R), green (G) and blue (B) with a film thickness of 1 µm for each, repeating R-G-B along the vertical direction of the pattern with aperture portions provided in the black matrix 102, and exposed by the aperture portions, to obtain the transparent substrate 100. The subpixel pixel dimensions of each of the color filters 103R, G, B were 180 µm in the vertical direction and 60 µm in the horizontal direction; unit pixels, obtained by combining one each of the subpixels of the red color filter 103R, green color filter 103G, and blue color filter 103B, were formed numbering 240 in the vertical direction and 320 in the horizontal direction.

In formation of the black matrix 102 and the color filters 103R, G, B, a black color filter material (product number CK-7001, manufactured by Fujifilm Electronic Materials), red color filter material (product number CR-7001, manufactured by Fujifilm Electronic Materials), green color filter material (product number CG-7001, manufactured by Fujifilm Electronic Materials), and blue color filter material (product number CB-7001, manufactured by Fujifilm Electronic Materials), were used.

Formation of Separating Partition Walls 110

As shown in FIG. 1, separating partition walls 110R/G and 110G/R were formed such that the tip faces of both length-direction end portions had incisions, and the width of the incisions expanded toward the inside to form cavity portions a.

An acrylic resin composition (product number NN810, manufactured by JSR) was spin-coated onto substantially the entire face of the transparent substrate 100, and after pre-baking, a photomask was used to perform exposure, development and post-baking were performed, and separating partition walls 110R/G with an inverted-trapezoid cross-sectional shape, of height 5 µm, upper-edge width 16 µm, and lower-edge width 12 µm with reverse-tapered side walls, were formed on the black matrix 102 between the red color filters 103R and green color filters 103G, as well as separating partition walls 110G/R with an inverted-trapezoid cross-sectional shape, of height 5 µm, upper-edge width 76 µm, and lower-edge width 72 µm with reverse-tapered side walls, were formed on the black matrix 102 above the blue color filters 103B between the red color filters 103R and green color filters 103G and on both sides thereof, as shown in FIG. 1, arranged in stripe shapes with an upper-edge interval of 180 µm.

Formation of Color Conversion Layers 120

A red color conversion layer formation ink, obtained by dissolving 50 parts by weight of coumarin 6 (first dye)+DCM (second dye) (coumarin 6/DCM molar ratio=48/2) in 1000 parts by weight toluene, and a green color conversion layer formation ink, obtained by dissolving 50 parts by weight of coumarin 6 (first dye)+DEQ (second dye) (coumarin 6/DEQ molar ratio=48/2) in 1000 parts by weight toluene, were each prepared.

An inkjet apparatus was used to dispense the red color conversion layer formation ink onto the red color filter 103R and the green color conversion layer formation ink onto the green color filter 103G in a nitrogen atmosphere, to form the ink layers, after which transfer into a vacuum drying furnace was performed without breaking the nitrogen atmosphere, drying was performed in a vacuum of $1.0 \times 10^{-3}$ Pa and temperature 100° C., to form a red color conversion layer 120R and green color conversion layer 120G, each of film thickness 500 nm, and a color conversion filter panel 10 was obtained.

Comparative Example 1

On a transparent substrate 100 similar to that used in Example 1, conventional type separating partition walls 110 without incisions in the tip faces of both length-direction end portions, shown in FIG. 8, were formed by a procedure similar to that of Example 1, after which a red color conversion layer 120R and green color conversion layer 120G were formed on the red color filter 103R and green color filter 103G respectively, similarly to Example 1, and a color conversion filter panel 10 was obtained.

Example 2

A procedure similar to that of Example 1 was used to form, on the black matrix 102 between color filters 103 on a transparent substrate 100 prepared by a procedure similar to that of Example 1, separating partition walls 110 the shape of the length-direction end portions of which had protruding portions on extensions of the color conversion layer formation regions outside the color conversion layer formation regions as shown in FIG. 2, and having U shape or V shape incisions in the tip faces; and on the red color filter 103R and green color filter 103G were formed a red color conversion layer 120R and green color conversion layer 120G respectively by a procedure similar to that of Example 1, to obtain a color conversion filter panel 10.

(Evaluations)

As a result of evaluations of color mixing within color conversion layer regions due to the passing of red color conversion layer formation ink or green color conversion layer formation ink over the length-direction end portions of the separating partition walls 110 on color conversion filter panels thus obtained, color mixing was found to occur within incisions provided in the tip faces in the length-direction end portions of the separating partition walls 110 in Example 1 and Example 2, but no color mixing was found within regions after passing over separating partition walls 110. On the other hand, in Comparative Example 1, color mixing was found both in regions after passing over separating partition walls 110, and on extensions of tip faces of separating partition walls 110.

Example 3

Preparation of a top-emission type organic EL display panel

The color conversion filter panel 10 prepared in Example 1, and an organic EL light-emitting panel 20 (see FIG. 7) manufactured separately from the color conversion filter panel 10, were transferred into a joining apparatus maintained in an atmosphere with oxygen and water concentrations of 5 ppm or lower, the processed face of the color conversion filter panel 10 was set facing upward, and a dispenser was used to apply an epoxy system ultraviolet-hardening adhesive (product name XNR-5516, manufactured by Nagase ChemteX Corp.) along the peripheral seal boundary as a peripheral seal material.

Next, 160 mg of a thermosetting type epoxy system adhesive with viscosity lower than that of the epoxy system ultraviolet-hardening adhesive was dripped into the center portion of the color conversion filter panel as a transparent resin 30, using a rotation-type mechanical measurement valve with a dispensing precision of within 5%.

The color conversion filter panel 10 and organic EL light-emitting panel 20 were set with the processed faces in mutual opposition, and the apparatus interior was depressurized to approximately 10 Pa. The two panels were brought into proximity in parallel with the distance between processed faces approximately 30 μm, and in a state in which the entire perimeter of the peripheral seal material was in contact with the organic EL light-emitting panel substrate 200, positioning of the two panels was performed, the peripheral seal material was exposed to cause temporary hardening, and the apparatus interior was gradually returned to atmospheric pressure, while simultaneously adding a slight load, causing joining of the color conversion filter panel 10 and the organic EL light-emitting panel 20, after which heating was performed to harden the transparent resin 30 and peripheral seal material, to prepare a top-emission type organic EL display panel.

In the organic EL display panel thus obtained, the transparent resin 30 was packed into the entirety of the screen region without excess or deficiency and without inclusion of air bubbles, and no unevenness in light emission was found.

Example 4

Preparation of a top-emission type organic EL display panel

A top-emission type organic EL display panel was prepared, by processing similar to that of Example 3, except that the color conversion filter panel prepared in Example 2 was used as the color conversion filter panel 10 of Example 3. In the organic EL display obtained, advantageous results similar to those of the organic EL display prepared in Example 3 were confirmed.

The invention claimed is:

1. A color conversion filter panel for configuring a color organic electroluminescent (EL) display in a screen region thereof, comprising:
    a transparent substrate;
    two adjacent color conversion layers, each for a different color and being in a stripe shape, formed on a portion of a surface of the transparent substrate; and
    a separating partition wall of a stripe shape formed between the two color conversion layers and demarcating the two color conversion layers, both length-direction end portions of the separating partition wall extending to outside the screen region, each of the length-direction end portions having an incision formed on a tip face thereof, the tip face being perpendicular to the surface of the substrate, the incision being enlarged toward inside the screen region to thereby form a cavity.

2. The color conversion filter panel according to claim 1, wherein the length-direction end portions of the separating partition wall each have a protruding portion formed thereon outside the screen region.

3. A color organic EL display, including an organic EL light-emitting panel, which emits light in a prescribed wavelength range, and the color conversion filter panel of claim 2.

4. The color conversion filter panel according to claim 1, wherein the two adjacent color conversion layers include a red color conversion layer and a green color conversion layer, the red color conversion layer converting light in a wavelength range of 400 nm to 600 nm into red light in a wavelength range of 600 nm or greater, and the green color conversion layer converting the light in the wavelength range of 400 nm to 600 nm into green light in a wavelength range of 500 nm to 600 nm.

5. A color organic EL display, including an organic EL light-emitting panel, which emits light in a prescribed wavelength range, and the color conversion filter panel of claim 4.

6. The color conversion filter panel according to claim 1, wherein the transparent substrate includes a black matrix, which is arranged in a matrix-like mesh shape or a stripe shape, and has an aperture portion with a dimension of one subpixel demarcating a color pattern, on a transparent supporting substrate.

7. The color conversion filter panel according to claim 6, wherein the transparent substrate further includes two color filters each arranged in a stripe shape and in close contact with the transparent supporting substrate, and exposed by the aperture portion of the black matrix, the two color conversion layers each being arranged on top of one of the color filters of a corresponding chromaticity.

8. A color organic EL display, including an organic EL light-emitting panel, which emits light in a prescribed wavelength range, and the color conversion filter panel of claim 7.

9. A color organic EL display, including an organic EL light-emitting panel, which emits light in a prescribed wavelength range, and the color conversion filter panel of claim 6.

10. The color conversion filter panel according to claim 1, wherein a protective layer is further provided on the color conversion layers.

11. A color organic EL display, including an organic EL light-emitting panel, which emits light in a prescribed wavelength range, and the color conversion filter panel of claim 10.

12. A color organic EL display, including an organic EL light-emitting panel, which emits light in a prescribed wavelength range, and the color conversion filter panel of claim 1.

13. A color conversion filter panel for configuring a color organic electroluminescent (EL) display in a screen region thereof, comprising:
    a transparent substrate, including
        a transparent supporting substrate;
        a black matrix arranged on a surface of the transparent supporting substrate in a matrix-like mesh shape having an aperture with a dimension of one subpixel demarcating a color pattern, and
        a plurality of color filters arranged in repeated stripe shapes of red color, green color and blue color, in close contact with the transparent supporting substrate and exposed by the aperture portion of the black matrix;
    a plurality of separating partition walls, arranged on the black matrix between the color filters of the transparent substrate, both length-direction end portions of each separating partition wall extending to outside the screen region, each of the length-direction end portions having an incision formed on a tip face thereof, the tip face being perpendicular to the surface of the transparent supporting substrate, the incision being enlarged toward inside the screen region to thereby form a cavity; and
    a plurality of red color conversion layers and green color conversion layers formed on top of the red color filters and the green color filters respectively.

14. A color organic EL display, including an organic EL light-emitting panel, which emits light in a prescribed wavelength range, and the color conversion filter panel of claim 13.

15. A color conversion filter panel for configuring a color organic electroluminescent (EL) display in a screen region thereof, comprising:
    a transparent substrate;
    two adjacent color conversion layers, each for a different color and being in a stripe shape, formed on a portion of the transparent substrate; and
    a separating partition wall of a stripe shape formed between the two color conversion layers and demarcating the two color conversion layers, both length-direction end portions of the separating partition wall extending to outside the screen region, and having an incision formed on a tip face thereof, the incision being enlarged toward inside the screen region to thereby form a cavity, a side wall on each of the length-direction end portions of the separating partition wall having a protrusion portion formed on an extension of a color conversion layer formation region, and a protrusion angle of the protrusion portion with respect to a line of the extension of the color conversion layer formation region being an angle that is greater than 0° and no greater than 30°,
    wherein the color conversion filter panel further includes a transparent resin layer thereon.

* * * * *